(12) United States Patent
Resta et al.

(10) Patent No.: US 7,075,841 B2
(45) Date of Patent: Jul. 11, 2006

(54) WRITING CIRCUIT FOR A PHASE CHANGE MEMORY DEVICE

(75) Inventors: Claudio Resta, Villa di Tirano (IT); Ferdinando Bedeschi, Monza (IT); Fabio Pellizzer, Follina (IT); Giulio Casagrande, Vignate (IT)

(73) Assignee: STMicroelectronics, S.r.l. (IT)

( * ) Notice: Subject to any disclaimer, the term of this patent is extended or adjusted under 35 U.S.C. 154(b) by 12 days.

(21) Appl. No.: 10/870,694

(22) Filed: Jun. 16, 2004

(65) Prior Publication Data
US 2005/0041498 A1 Feb. 24, 2005

(30) Foreign Application Priority Data
Jun. 16, 2003 (EP) ................................. 03425390

(51) Int. Cl.
*G11C 7/00* (2006.01)

(52) U.S. Cl. .................................. 365/203; 365/189.01

(58) Field of Classification Search ................. 365/203
See application file for complete search history.

(56) References Cited

U.S. PATENT DOCUMENTS

| 3,922,648 | A | 11/1975 | Buckley | 340/173 |
| 4,225,946 | A | 9/1980 | Neale et al. | 365/163 |
| 6,487,113 | B1 | 11/2002 | Park et al. | 365/163 |
| 6,868,031 | B1* | 3/2005 | Ooishi | 365/230.03 |
| 2003/0002332 | A1 | 1/2003 | Lowrey | 365/163 |
| 2003/0081451 | A1 | 5/2003 | Lowrey et al. | 365/163 |

FOREIGN PATENT DOCUMENTS

WO  WO 03/058633 A1  7/2003

OTHER PUBLICATIONS

European Search Report, EP 03425390, Nov. 20, 2003.

* cited by examiner

*Primary Examiner*—Thong Q. Le
(74) *Attorney, Agent, or Firm*—Lisa K. Jorgenson; Paul F. Rusyn; Graybeal Jackson Haley LLP

(57) ABSTRACT

A memory device of a phase change type, wherein a memory cell has a memory element of calcogenic material switcheable between at least two phases associated with two different states of the memory cell. A write stage is connected to the memory cell and has a capacitive circuit configured to generate a discharge current having no constant portion and to cause the memory cell to change state.

31 Claims, 6 Drawing Sheets

WRITING CIRCUIT FOR A PHASE CHANGE MEMORY DEVICE

PRIORITY CLAIM

This application claims priority from European patent application No. 03425390.6, filed Jun. 16, 2003, which is incorporated herein by reference.

TECHNICAL FIELD

The present invention relates to a writing circuit for a phase change memory (PCM) device.

BACKGROUND

As is known, phase change memory (PCM) arrays are based upon memory elements which use a class of materials that have the property of switching between two phases having distinct electrical characteristics, associated to two different crystallographic structures of the material forming the memory element, and precisely an amorphous, disorderly phase and a crystalline or polycrystalline, orderly phase. The two phases are hence associated to resistivities of considerably different values.

Currently, the alloys of elements of group VI of the periodic table, such as Te or Se, referred to as calcogenides or calcogenic materials, can be used advantageously in phase change memory cells. The currently most promising calcogenide is formed from an alloy of Ge, Sb and Te ($Ge_2Sb_2Te_5$), which is now widely used for storing information on overwritable disks.

In the calcogenides, the resistivity varies by two or more orders of magnitude when the material passes from the amorphous (more resistive) phase to the crystalline (more conductive) phase, and vice versa. In the amorphous state, moreover, the resistivity depends to a marked extent upon the temperature, with variations of approximately one order of magnitude every 100° C. with a behavior typical of P-type semiconductors.

Phase change can be obtained by locally increasing the temperature. Below 150° C., both the phases are stable. Above 200° C., there is a rapid nucleation of the crystallites and, if the material is kept at the crystallization temperature for a sufficiently long time, it undergoes a phase change and becomes crystalline. To bring the calcogenide back to the amorphous state it is necessary to raise the temperature above the melting temperature (approximately 600° C.) and then rapidly cool off the calcogenide.

From the electrical standpoint, it is possible to reach the crystallization and melting temperatures by causing a current to flow through a resistive element (also called a heater) that heats the calcogenic material by the Joule effect. FIG. 1 illustrates, in a simplified way, the behavior of the resistance of a calcogenic material as a function of the heating current and the logic values associated thereto, wherein RR indicates the resistance corresponding to the amorphous state (reset state or logic "0") and $R_S$ indicates the resistance corresponding to the crystalline or polycrystalline state (set state or logic "1").

The programming curve of a phase change memory element is shown in FIG. 2. Curve A represents the behavior of a PCM element in the reset state (high resistivity) and curve B represents the behavior of a PCM element in the set state (low resistivity), when a voltage of an increasing value is applied.

As shown, when a voltage higher than a threshold value (Vth) is applied to an element in the reset state, with Vth being a function of the material and the geometry of the element, the cell changes its state and switches from the high resistivity curve A to the low resistivity curve B.

When the cell is in the set state along curve B, it is necessary to apply a voltage/current pulse of suitable length and high amplitude (greater than Vreset/Imelt) so as to cause the element to switch to the amorphous phase associated to a high resistivity. The resetting pulse should be interrupted in a short time (quench time) of about 1–10 ns.

To bring the element in the set state (so as to cause crystallization of the calcogenic material and thus switching to a low resistivity state) it is necessary to apply a voltage/current pulse of a suitable length and amplitude (portion of curve B comprised between I1 and I2), however avoiding any quenching and allowing the element to cool slowly.

FIG. 3 shows the current amplitudes ($I_S$, $I_R$) of typical set and reset current pulses and the respective set and reset time lengths ($t_S$, $t_R$).

The structure of a phase change memory array using a calcogenic element as a storage element is shown in FIG. 4. The memory array 1 of FIG. 4 comprises a plurality of memory cells 2, each including a memory element 3 of the phase change type and a selection element 4 formed here by an NMOS transistor. Alternatively, the selection element 4 may be formed by a bipolar junction transistor or a PN diode.

The memory cells 2 are arranged in rows and columns. In each memory cell 2, the memory element 3 has a first terminal connected to an own bitline 11 (with addresses BLn−1, BLn, . . . ), and a second terminal connected to a first conduction terminal of an own selection element 4. The selection element 4 has a control terminal connected to an own control line, also referred to as wordline 12 (with addresses WLn−1, WLn, . . . ), and a second conduction terminal connected to ground.

For biasing the memory element 3 belonging to a specific cell 2, for example the one connected to the bitline BLn−1 and to the wordline WLn−1, to a suitable voltage (V2−V1), the bitline 11 connected to the selected cell is brought to a first voltage V1 and the wordline 12 connected to the selected cell is brought to a high voltage, so that the second terminal of the memory element 2 is biased to a second voltage V2 close to zero.

Writing is effected by applying to a selected cell the current pulses shown in FIG. 3.

The application of the constant current pulses of FIG. 3 is however disadvantageous since variations in the manufacturing process may cause a considerable variation in the current requested for programming a memory cell. The programming current depends on the contact area between the calcogenic material and the heater; in particular, bigger contact areas require higher programming currents and vice-versa. As a matter of facts, the requested programming current ranges between I1 and I2 in FIG. 2, considering a safety margin. Thus, the application of a single programming current value may not be able to ensure programming of all the memory cells (all bits).

U.S. Pat. No. 6,487,113 describes a method for programming a phase-change memory with a short quench time based on applying a high current pulse to all the cells, to bring them in a first state, decreasing some of the currents to lower levels at sufficiently high rates to cause the corresponding cells to be programmed to the first state and decreasing the other currents at sufficiently low rates to cause the other cells to be programmed to a second state.

The above solution allows the quench time to be reduced, but has the drawback of requiring a complex and bulky programming circuit. The programming circuits shown therein also dissipate high currents.

SUMMARY

An aspect of the invention is therefore to overcome the drawbacks referred to above, devising a simple writing circuit requiring a small integration area.

According to another aspect of the present invention a phase change memory device and a corresponding write method are provided.

According to one aspect of the invention, programming of a memory cell is carried out using the discharge current of a capacitive circuit to generate the pulse necessary to set or reset the memory cell. Thus, programming is no longer obtained by applying a rectangular pulse having at least one portion with constant amplitude (FIG. 3), but the programming current has a substantially exponential behavior, as discussed in more detail later on.

In practice, with reference to FIG. 2, during programming the cell characteristic is caused to follow the plot of curve B in the decreasing direction for a suitable long time.

According to another aspect of the invention, an RC pulse is obtained using the capacitors already present in the charge pump used for biasing the selected bit line(s).

BRIEF DESCRIPTION OF THE DRAWINGS

For a better understanding of the present invention, there are now described preferred embodiments, purely by way of non-limiting example, with reference to the attached drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 4:
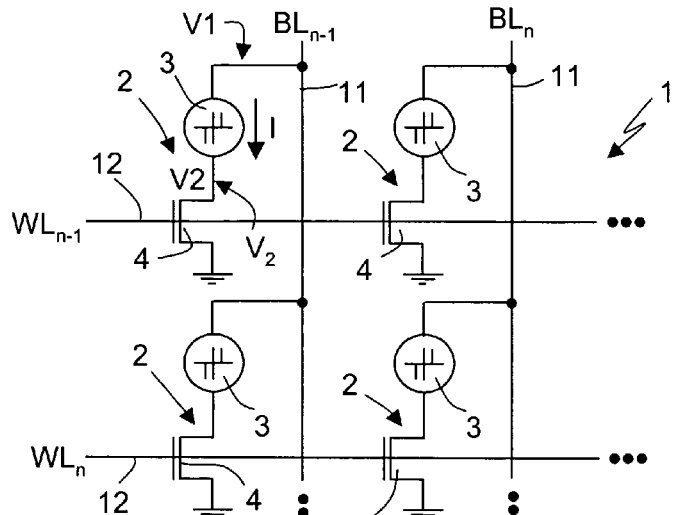
FIG. 4 is a circuit diagram of an array of PCM cells.
Figure 5:
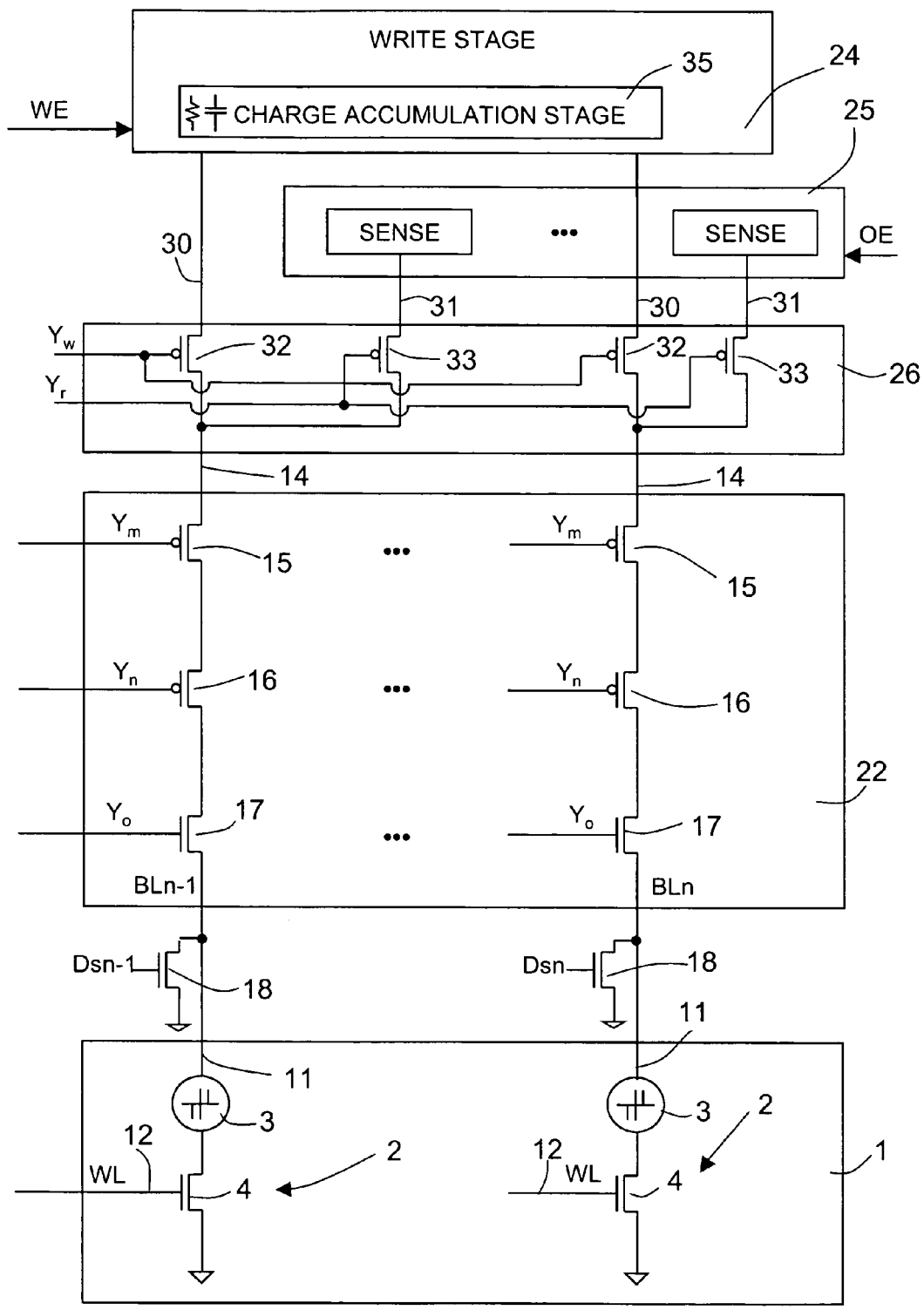
FIG. 5 illustrates a block diagram of the architecture of the present memory device according to an embodiment of the present invention.

According to FIG. 5, a phase change memory (PCM) device 20 comprises a memory array 1 having the structure illustrated in FIG. 4, the memory cells 2 whereof are addressed through wordlines 12 (having addresses WLn−1, WLn, . . . ) and through bitlines 11 (having addresses BLn−1, BLn, . . . ).

The bitlines 11 extend from a column decoder 22 formed by a plurality of selection switches implemented by NMOS or PMOS transistors, connected in series between biasing nodes 14 and the bitlines 11 and controlled by respective column selection signals so as to select and bias each time some selected bitlines 11 (of a number equal to the number of cells that are read/written simultaneously). The number of selection switches forming the column selector 22 depends upon the dimensions of the memory array or of each sector and upon the memory organization. For example, in FIG. 5 each path between a biasing node 14 and a bitline 11 comprises two PMOS transistors 15 and 16, controlled by respective column selection signals Yin, Yn, and an NMOS transistor 17, operating also as a cascode and controlled by a respective column selection signal Yo. NMOS transistor 17 may be of the natural type, that is low threshold type, as discussed in European Patent Application No. 01830808.0 filed on 27 Dec., 2001, which is incorporated herein by reference.

Each bitline 11 is moreover connected to a first conduction terminal of an own discharge transistor 18. Each discharge transistor 18 has a second terminal grounded and a control terminal receiving control signal Dsn−1, Dsn, so as to be selectively enabled.

The column decoder 22 is selectively connected to a write stage 24 or to a read stage 25 through a read/write selector 26.

The read/write selector 26 comprises a plurality of pairs of PMOS transistors selectively connecting each biasing node 14 to an own write line 30 or to an own read line 31. Each pair of PMOS transistors include a write transistor 32 and a read transistor 33. All the write transistors 32 are controlled by a same write enable signal Yw, and all the read transistors 33 are controlled by a same read enable signal Yr. The write lines 30 are connected to as many outputs of the write stage 24; the read lines 31 are connected to as many outputs of the read stage 25.

The write stage 24 (described in greater detail with reference to FIG. 6, and receiving a write enable signal WE) generates the currents necessary for writing. In detail, the write stage 24 comprises a charge accumulation stage 35 including RC circuits that store the writing charges and are discharged when so enabled by a control circuitry.

The read stage 25, having e.g. the structure disclosed in European Patent Application No. 03425098.5 filed on 21 Feb. 2003 in the name of the same applicant, which is incorporated herein by reference, has the function of reading the information content of the selected memory cells and is controlled by a read enable signal OE.

When memory array 1 is accessed, the bitlines 11 connected to the memory cells to be read/written are selected by suitably switching PMOS transistors 15, 16 and NMOS transistor 17.

During writing, the write transistors 32 are on and the read transistors 33 are off. The PMOS transistors 15, 16 and the NMOS transistors 17 corresponding to the selected bitlines 11 (as well as the write transistors 32) are biased so as to reduce as much as possible the voltage drop across them;

i.e., the signals Ym, Yn, Yw are brought low (for example to ground), and the signals Yo are brought high (to a value such as not to significantly limit the writing current). The current supplied to the memory cell 2 is supplied by the write stage 24. The current value depends on the datum to be written. For example, if the datum is "1", a set current is applied; if the datum is "0", a reset current is applied.

During reading, the read transistors 33 are turned on, and the write transistors 32 are turned off. Reading takes place in a per se known manner.

Figure 6:
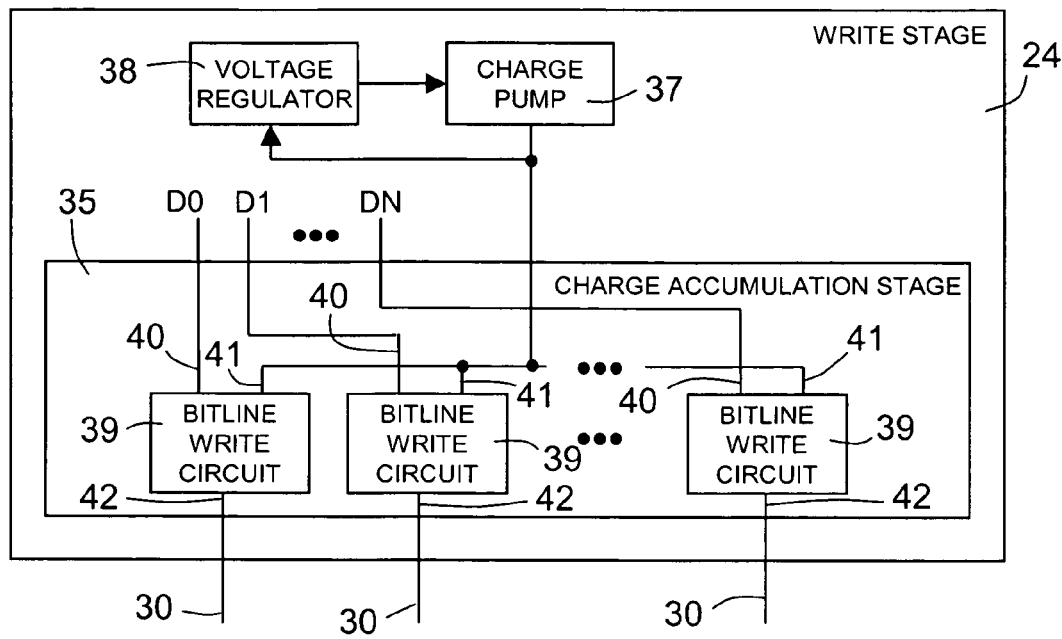
FIG. 6 illustrates a more detailed diagram of a part of the memory device of FIG. 5 according to an embodiment of the present invention.

FIG. 6 shows the block diagram of a first embodiment of the write stage 24. The write stage 24 comprises a charge pump 37, a voltage regulator 38 and the charge accumulation stage 35.

The charge pump 37 has any known structure and generates the voltages necessary for operation of the write stage 24 and read stage 25.

The voltage regulator 38 is connected to the charge pump 37 and has the task of stabilizing the operating voltages.

The charge accumulation stage 35 comprises a plurality of bitline write circuits 39, one for each selected bitline 11 (N for words of N bits). Each bitline write circuit 39 has a data input 40 receiving a datum to be written (D0, D1, . . . , DN), a charging input 41 connected to the charge pump 37, and a write output 42 connected to an own write line 30.

Figure 7:
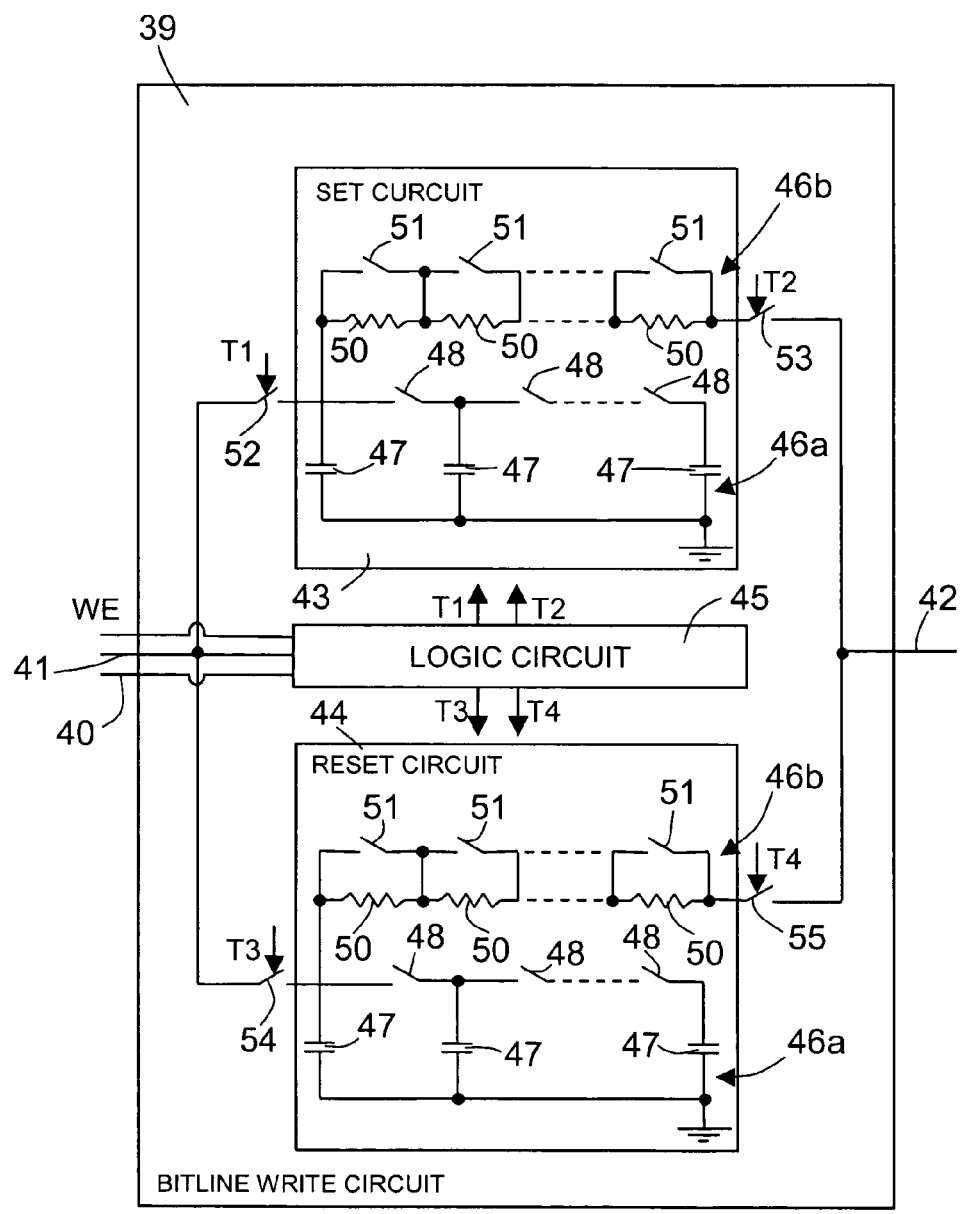
FIG. 7 is more detailed diagram of a block of FIG. 6, according to a first embodiment of the present invention.

Each bitline write circuit 39, one embodiment whereof is shown in FIG. 7, comprises a set circuit 43, a reset circuit 44 and a logic circuit 45.

As shown in FIG. 7, the set circuit 43 and the reset circuit 44 have the same structure and are formed essentially by a capacitive branch 46a and a resistive branch 46b.

Each capacitive branch 46a is connected between the charging input 41 and ground and comprises a plurality of capacitors 47, connected in parallel via a plurality of controlled switches 48 allowing selection of the number of connected capacitors 47 and thus the overall capacitance of the capacitive branch 45.

Each resistive branch 46b is connected between the charging input 41 and the write output 42 and comprises a plurality of resistors 50 connected in series. A corresponding plurality of switches 51 are provided, each connected in parallel to a respective resistor 50 for bypassing it 50 and thus modify the overall resistance of the resistive branch 46b.

A first input switch 52 is connected between the charging input 41 and the set circuit 43 and receives a control signal T1; a first output switch 53 is connected between the set circuit 43 and the write output 42 of the bitline write circuit 39 and receives a control signal T2; analogously, a second input switch 54 is connected between the charging input 41 and the reset circuit 44 and receives a control signal T3; a second output switch 55 is connected between the reset circuit 44 and the write output 42 of the bitline write circuit 39 and receives a control signal T4.

The logic circuit 45 has an input connected to data input 40 and outputs connected to switches 52–55 and outputting control signals T1–T4. The logic circuit 45 also receives the write enable signal WE as well as timing signals from a control unit of the memory device 20, not shown.

As indicated, by controlling the state of the switches 48, 51 (and thus the number of capacitors 47 and resistors 50 connected in the capacitive branch 46a and in the resistive branch 46b) it is possible to trim the overall capacity of the capacitive branch 46a and the overall resistance of the resistive branch 46b. By suitably selecting the overall capacitance and resistance, as well as by suitably selecting the charging voltage of the capacitors it is possible to shape the desired current pulse, as below discussed, and to compensate for any variation in the circuit parameters due to process spread.

During writing, according to the value of the datum to be written, fed on data input 40, the logic circuit 45 activates selectively the set circuit 43 or the reset circuit 44, through control signals T1–T4.

If the datum to be written is a "1", the logic circuit 45 activates the set circuit 43, by closing switches 52, 53. In this condition, the set circuit 43 is connected to the charge pump 37, causing the capacitors 47 and any parasitic capacitance associated with the bitline write circuit 39 and the selected bitline 11 to be charged.

Then, control signal T1 switches, disconnecting the set circuit 43 from the charge pump 37. After biasing the selected wordlines 12, the capacitors 47 discharge through the resistive branch 46b, any parasitic resistance and the resistance of the selected memory cell 2, generating a current I having the plot shown in FIG. 8. After the current I has reached value I2, it is possible to disconnect the selected bitline 11 from the set circuit 43, by opening switch 53. Thereby it is possible to maintain the residual charge in the capacitive branch 46a, and so obtain an energy saving.

At the end of writing, the set circuit 43 is connected again to the charge pump 37 by closing switch 52. Recharging of the capacitive branch 46a is thus carried out only from the residual voltage.

Figure 1:
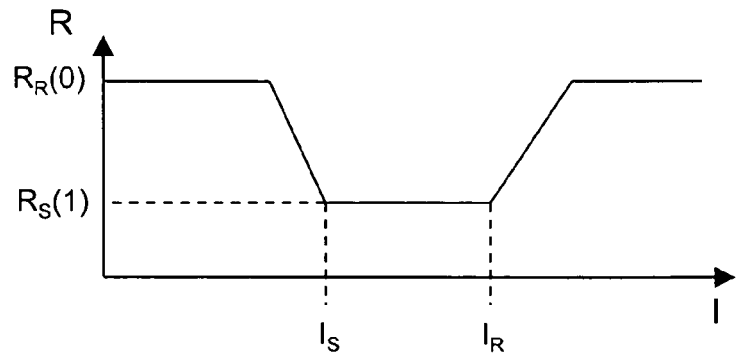
FIG. 1 shows the plot of the resistance in set PCM cells and reset PCM cells as a function of the current.
Figure 2:
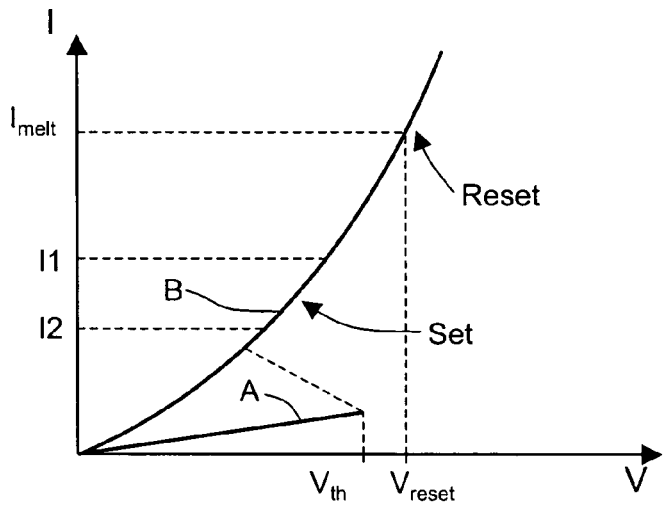
FIG. 2 shows a current versus voltage plot of PCM cells during programming.
Figure 3:
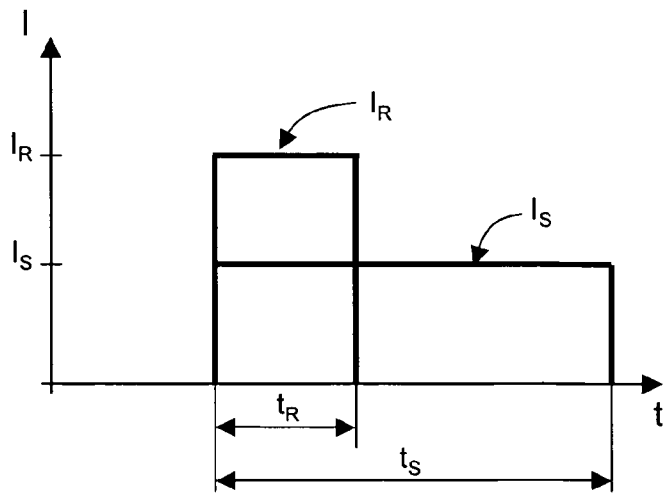
FIG. 3 shows the shape of programming pulses according to the prior art.

As indicated, by using the relationship describing the behavior of the discharge current in an RC circuit, it is possible to suitably dimension the set circuit. Specifically, since the current values I1 and I2 (see FIG. 2) as well as the set time tset (time necessary to set a memory cell 2) are preset physical parameters, by fixing the resistance R (including the resistance of the resistive branch 46b and the resistance of the memory cell 2) and the voltage Vp supplied by the charge pump, it is possible to calculate the capacitance C of the capacitive branch 46a that causes the discharge current I to follow the discharge curve shown in FIG. 8.

Specifically, by neglecting the parasitic resistances and capacitance, we have:

$$t2-t1=t\text{set}$$

$$(R*I1)/Vp=\exp(-t1/RC)$$

$$(R*I2)/Vp=\exp(-t2/RC)$$

By defining:

$$K=\ln(R*I1/Vp)/\ln(R*I2Np)=t1/t2$$

it follows:

$$t1=t\text{set}*K/(K-1) \quad (1)$$

$$t2=t\text{set}/(K-1) \quad (2)$$

$$RC=[K*t\text{set}/(K-1)]/\ln(R*I1/Vp) \quad (3)$$

From equations (1)–(3) it is thus possible to calculate the capacitance C of the capacitive branch 46a.

If the datum to be written is a "0", the logic circuit 45 activates the reset circuit 44, by closing switches 54, 55. In this condition, the reset circuit 44 is connected to the charge pump 37, causing the capacitors 47 and any parasitic capacitance associated with the bitline write circuit 39 and the selected bitline 11 to be charged.

Then, control signal T3 switches, disconnecting the reset circuit 44 from the charge pump 37. After biasing the selected wordlines 12, the capacitors 47 of the reset circuit 44 discharge through the resistive branch 46b, any parasitic resistance and the resistance of the selected memory cell 2, generating a current also having the plot shown in FIG. 8. To allow a correct operation of the reset circuit, pump voltage Vp should be higher than voltage Vreset of FIG. 2. In particular, reset occurs in a portion of curve B of FIG. 2 above the melting point (Imelt, Vreset). The reset current may have such a high value to ensure reset of all the memory cells 2, taking into account any spread in the reset current due to process variation, or move along curve B (but remaining above Imelt) in a very short time. In both cases, the value of the programming current at the end of the reset is very near to the beginning value, so as to practically consider the reset current to be an approximately constant pulse.

After a preset time, when the memory cell 2 has changed to the reset state, the discharge transistor 18 (FIG. 5) is switched on by the respective control signal Ds, thus allowing the quench. Then, also switch 55 is opened, and switch 54 is closed to allow connection of the reset circuit 44 to the charge pump 37.

Figure 9:
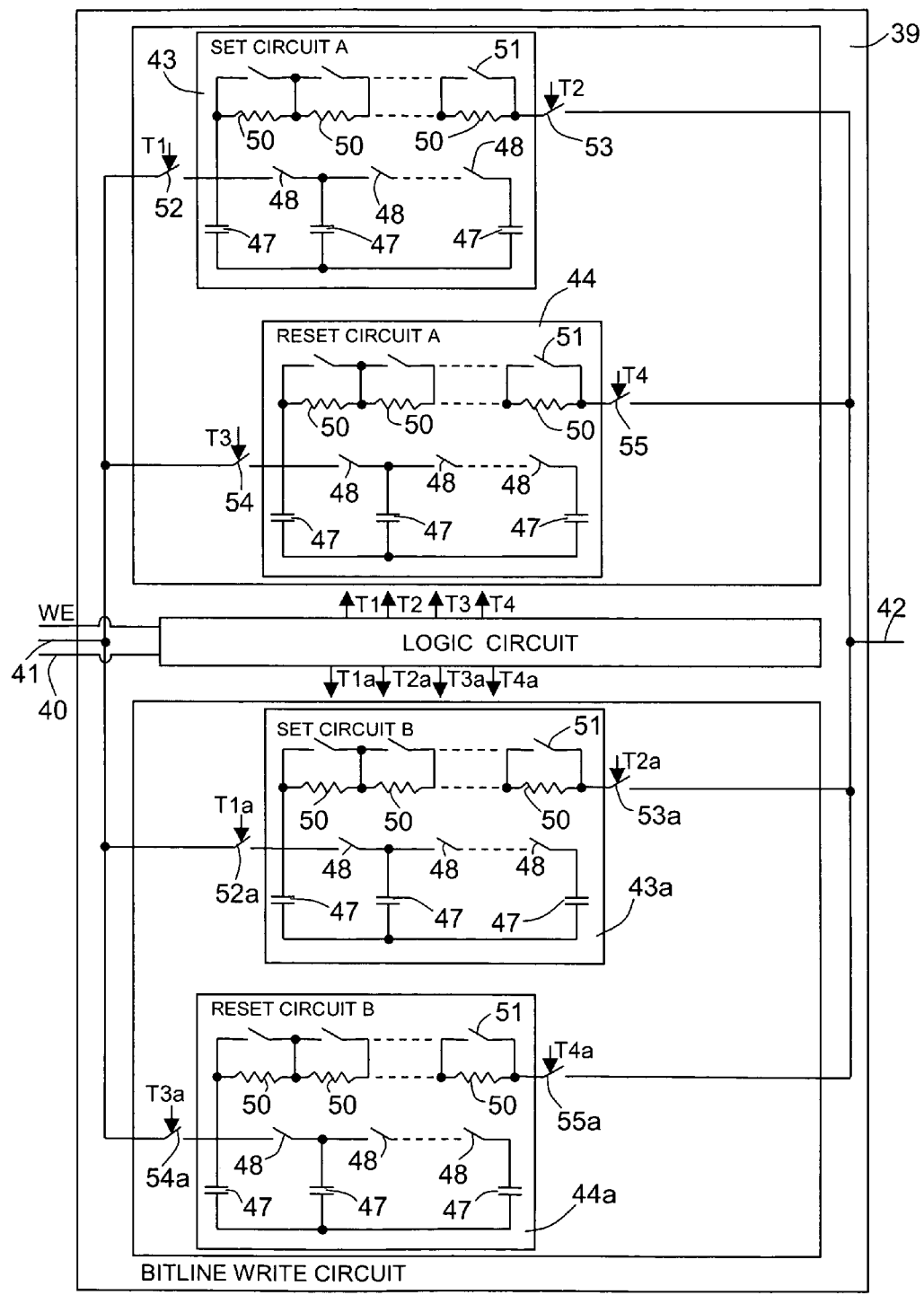
FIG. 9 illustrates a more detailed diagram of a block of FIG. 6, according to a second embodiment of the present invention.

In order to reduce the memory access time during writing, it is possible to use an architecture that allows a reduction in the waiting time due to the charging of the capacitors 47 of the set and reset circuits 43, 44 of FIG. 7, as shown in FIG. 9, illustrating a different embodiment of a bitline write circuit 39.

According to FIG. 9, each bitline write circuit 39 comprises, in addition to the logic circuit 45, set circuit 43 and reset circuit 44, a further set circuit 43a and a further reset circuit 44a. Further set circuit 43a has the same structure as set circuit 43; further reset circuit 44a has the same structure as reset circuit 44.

Thus, the logic circuit 45 generates further control signals T1a–T4a for further input and output switches 52a–55a.

The logic circuit 45 alternately activates the set circuit 43 and the further set circuit 43a in subsequent set operations; analogously, the reset circuit 44 and the further reset circuit 44a are controlled alternately by the logic circuit 45. Thereby, after a set operation carried out using e.g. set circuit 43, the further set circuit 43a is immediately ready to generate the discharge current I; meanwhile the set circuit 43 is charged again by charge pump 37 to the pump voltage Vp. Analogously, if reset circuit 44 is used to carry out a reset step, the following reset current is generated through the further reset circuit 44a.

Thus, no time is lost during two subsequent set or reset operations to allow charging of the relative circuit.

According to another embodiment of the invention, the capacitor 47 may be formed by the output capacitor of the charge pump, that has here the double function of voltage generator and charge accumulator.

Figure 10:
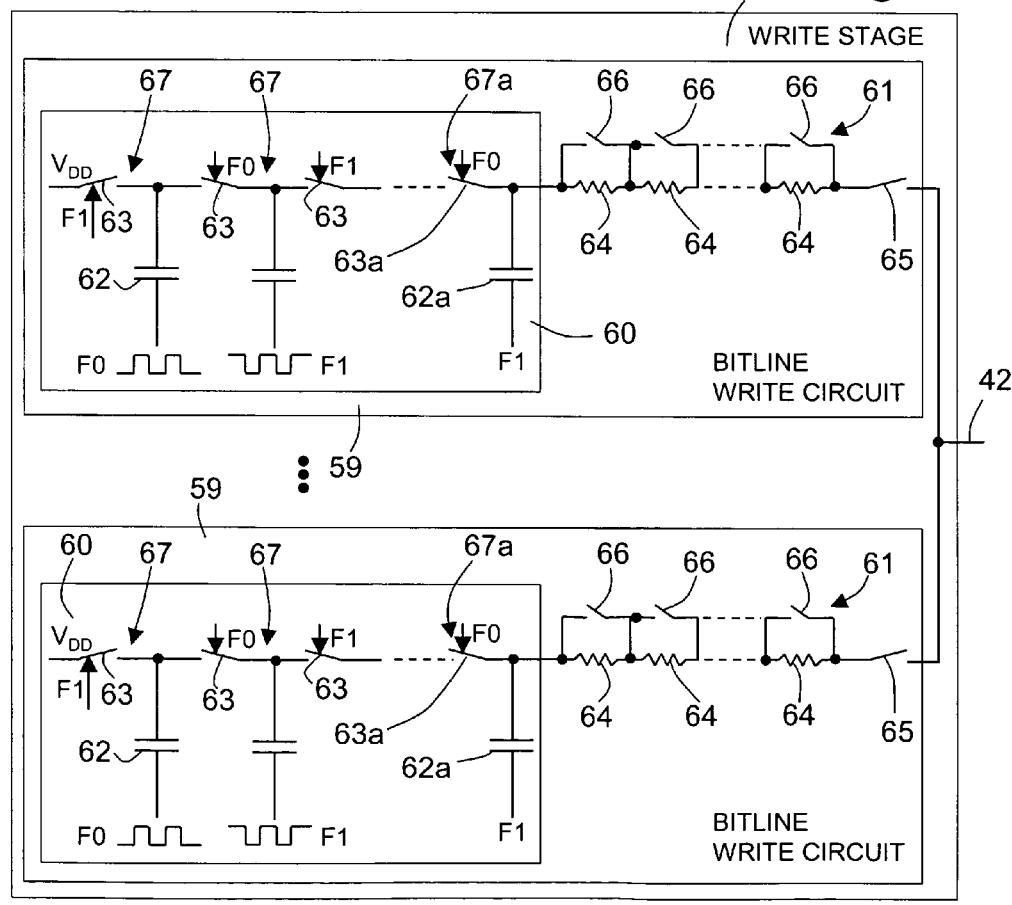
FIG. 10 illustrates a more detailed diagram of a block of FIG. 6, according to a third embodiment of the present invention.

Accordingly, FIG. 10 illustrates a write stage 24 including a plurality of bitline write circuits 59, one for each selected bitline 11. Each bitline write circuit 59 includes a charge pump 60 and a resistive circuit 61 cascade-connected. A switch 65 is coupled between the resistive circuit 61 and the write output 42.

Each charge pump 60 includes a plurality of cascade-connected pumping stages 67, each formed by a switch 63, coupled between the input and the output of the respective stage, and by a capacitor 62, having a first terminal connected to the output of the respective stage and a second terminal receiving a phase signal F0, F1. In a per se known manner, the phase signal F0, F1 fed to the second terminal of each capacitor 62 is in phase opposition to the phase signal F1, F0 supplied to the neighboring capacitors and is also in phase opposition to the control signals fed to the switch 63 belonging to the same pumping stage 67.

The last capacitor 62a belonging to an output stage 67a defines an accumulation capacitor connected to the resistive circuit 61.

The resistive circuit 61 has the same structure as the resistive branch 46b of FIG. 7 and comprises a plurality of resistors 64 that are connected in series and may be selectively bypassed by respective switches 66.

Figure 8:
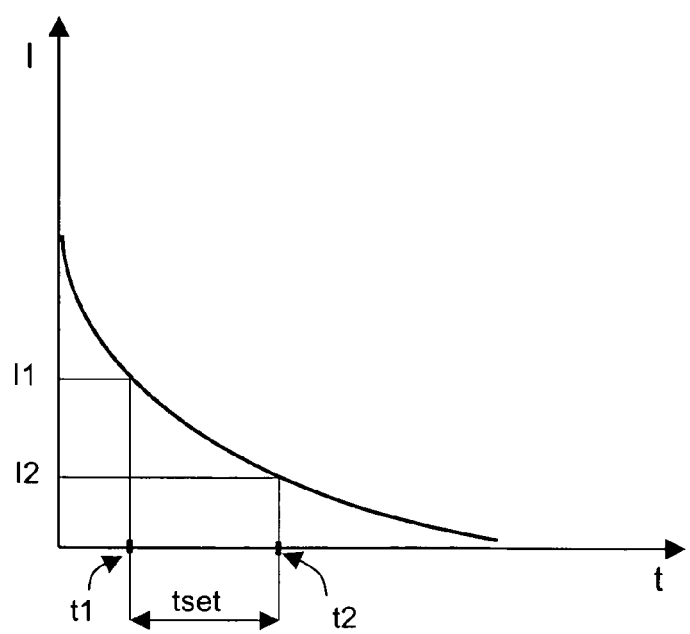
FIG. 8 illustrates the plot of the programming current versus time according to an embodiment of the invention.

In the circuit of FIG. 10, the charge pump 60 charges the accumulation capacitor 62a to the pump voltage Vp in a per se known manner; during writing, the switch 65 is closed and allow discharge of the accumulation capacitor 62a (which is now disconnected from the preceding capacitors 62 by switch 63a) through the resistive circuit 61, analogously to what described with reference to FIGS. 7 and 8. In practice, the bitline write circuits 59 of FIG. 10 initially generate equal programming currents for all the memory cells 2 connected to the selected bitlines 11, by activating the discharge of all the accumulation capacitors 62a. Only for the memory cells 2 that should be reset, the programming current is interrupted by activating the respective discharge transistor 18 through the respective control signal Dsn−1, Dsn (FIG. 5), while for the memory cells 2 that should be set, the discharge goes on until current value I2 of FIG. 2, analogously to what described above for the circuit of FIG. 7.

The advantages of the memory device described herein are at least the following. The set operation is very reliable and setting of the memory cells is always ensured, by virtue that programming involves supplying a programming current that follows the plot of curve B shown in FIG. 2 so that the voltage/current operating point necessary for setting is always crossed.

The write stage is simple and does not require a big integration area; this advantage is particularly evident for the embodiment of FIG. 10, where the capacitors already present in the output stage are exploited also for generating the RC type current.

The regulation circuits are reduced, so that the present memory device affords a current and an area saving.

By interrupting the discharge of the charge accumulation components when the memory cells to be written have been set (instant t2 in FIG. 8), it is possible to obtain a current saving and thus both dissipation and the subsequent charging time are reduced.

Finally, it is clear that numerous modifications and variations can be made to the embodiments of the PCM device described and illustrated herein, all of which fall within in the scope of the invention, as defined in the annexed claims. Moreover, the PCM device may be contained in a variety of different types of electronic systems, such as a computer system.

As indicated, the charge accumulation stage may be implemented through an own circuitry, or exploiting any suitable components already present in the memory device.

A same write stage may be used both for the set and the reset operations; in this case, the reset operation may be interrupted after a preset time (before reaching the set portion of the curve B in FIG. 2) or by adapting the electrical parameters and thus the specific set and reset currents according to the operation to be carried out, e.g. by modifying the charging voltage and/or the number of capacitors/resistors connected in the capacitive/resistive branch.

From the foregoing it will be appreciated that, although specific embodiments of the invention have been described herein for purposes of illustration, various modifications may be made without deviating from the spirit and scope of the invention.

The invention claimed is:

1. A memory device of a phase change type, comprising:
a memory cell, comprising a memory element of calcogenic material switcheable between at least two phases associated with two different states of said memory cell; and
a write stage connected to said memory cell;
wherein said write stage comprises a first capacitive circuit configured to generate from a write node a set current having a first amplitude and a first duration and a second capacitive circuit configured to generate from the write node a reset current having a second amplitude and a second duration, each current causing said memory cell to change state.

2. The memory device according to claim 1, wherein said capacitive circuit comprises an RC-type circuit.

3. The memory device according to claim 1, wherein said write stage comprises a data input receiving a data signal specifying whether said memory cell is to be brought in a first or a second state and said first capacitive circuit is operable responsive to the data signal to generate the set current and said second capacitive circuit is operable responsive to the data signal to generate the reset current, wherein the first amplitude is less than the second amplitude and the first duration is greater than the second duration, each current having no constant portions.

4. A memory device of a phase change type, comprising:
a memory cell, comprising a memory element of calcogenic material switcheable between at least two phases associated with two different states of said memory cell; and
a write stage connected to said memory cell;
wherein said write stage comprises a capacitive circuit configured to generate a discharge current having no constant portion and to cause said memory cell to change state;
wherein said write stage comprises a data input receiving a data signal specifying whether said memory cell is to be brought in a first or a second state and said capacitive circuit is configured to selectively generate a first write current and a second write current having no constant portions in response to said data signal and
wherein said write stage comprises a logic circuit receiving said data signal and generating first and second control signals; a first write circuit of RC type receiving said first control signals; and a second write circuit of RC type receiving said second control signals, said first and second write circuits being selectively activated by said first and second control signals to generate said first and second write currents.

5. The memory device according to claim 4, wherein said first and second write circuits are equal.

6. The memory device according to claim 4, wherein said write stage comprises a charge input receiving a supply voltage and a write output connected to said memory cell, and wherein said first and second write circuits comprise each a respective capacitive branch and a respective resistive branch; said capacitive branches being connected between said charge input and a reference potential line; and said resistive branches being connected between said charge input and said write output.

7. The memory device according to claim 4, comprising a memory array; a plurality of bitlines connected to said memory array; a column decoder connecting some selected bitlines of said plurality of bitlines to said write stage, said write stage comprising a plurality of bitline write circuits connected each to a respective selected bitline, each bitline write circuit including an own RC-type circuit.

8. The memory device according to claim 6, wherein said write stage comprises at least a first input switch coupled between said charge input and said first write circuit, a second input switch coupled between said charge input and said second write circuit, a first output switch coupled between said first write circuit and said write output and a second output switch coupled between said second write circuit and said write output.

9. The memory device according to claim 6, wherein said capacitive branch comprises a plurality of capacitors connectable in parallel through respective switches and said resistive branch comprises a plurality of resistors connected in series and a corresponding plurality of switches connected in parallel to said resistors for selectively bypassing said resistors.

10. The memory device according to claim 4, wherein said write stage comprises a third and a fourth write circuits of RC type; said logic circuit generating further control signals for said third and fourth write circuits so as to alternately activate said first and third write circuits when said data signal specifies that said memory cell is to be brought in said first state and to alternately activate said second and fourth write circuits when said data signal specifies that said memory cell is to be brought into said second state.

11. A memory device of a chase chance type, comprising:
a memory cell, comprising a memory element of calcogenic material switcheable between at least two phases associated with two different states of said memory cell; and
a write stage connected to said memory cell;
wherein said write stage comprises a capacitive circuit configured to generate a discharge current having no constant portion and to cause said memory cell to chance state; and
wherein said write stage comprises a charge pump and a charge accumulation stage, said charge pump generating a biasing voltage fed to said charge accumulation stage, and said charge accumulation stage comprising said capacitive circuit.

12. A memory device of a chase change type, comprising:
a memory cell, comprising a memory element of calcogenic material switcheable between at least two phases associated with two different states of said memory cell; and
a write stage connected to said memory cell;
wherein said write stage comprises a capacitive circuit configured to generate a discharge current having no constant portion and to cause said memory cell to chance state;
wherein said capacitive circuit includes an RC-type circuit; and
wherein said write stage comprises a charge pump and a discharge stage, said charge pump including at least one capacitive component and said discharge stage including at least one resistive component, said capacitive component and said resistive component forming said RC-type circuit.

13. The memory device according to claim 12, wherein said discharge stage comprises a resistive circuit including a plurality of resistors connected in series and a corresponding plurality of switches connected in parallel to said resistors for selectively bypassing said resistors.

14. A memory device of a phase chance type, comprising:
a memory cell, comprising a memory element of calcogenic material switcheable between at least two chases associated with two different states of said memory cell; and
a write stage connected to said memory cell;
  wherein said write stage comprises a capacitive circuit configured to generate a discharge current having no constant portion and to cause said memory cell to change state,
  wherein said write stage comprises a data input receiving a data signal specifying whether said memory cell is to be brought in a first or a second state and said capacitive circuit is configured to selectively generate a first write current and a second write current having no constant portions in response to said data signal; and
  wherein a bitline is coupled between said write stage and said memory cell, a discharge element being connected to said bitline and being activated to rapidly reduce said second write current after a preset time from generating said second write current.

15. A method for writing a phase change memory device comprising:
  generating a first capacitive discharge write current having a first amplitude, duration, and direction;
  generating a second capacitive discharge write current having a second amplitude, a second duration, and the first direction; and
  feeding either the first or the second write current to a memory element of calcogenic material to cause said memory element to switch between at least two states.

16. The method according to claim 15, comprising receiving a data signal specifying whether said memory element is to be brought in a first or a second state, wherein said step of generating a capacitive discharge current comprises selectively generating a first write current and a second write current having no constant portions in response to said data signal.

17. The method according to claim 15, wherein said first write current is a set current associated to a crystalline or quasi-crystalline phase and said second write current is a reset current associated to an amorphous phase.

18. The method according to claim 17, wherein said set current is interrupted after a first preset time.

19. The method according to claim 18, wherein said reset current is interrupted after a second preset time, less than said first preset time.

20. A write circuit adapted to program a phase change memory cell formed from a material that is changeable between at least two phases, with each phase corresponding to particular data stored in the memory cell, the write circuit including,
  a capacitive circuit having a node adapted to be coupled to a first end of a bit line that is coupled to the phase change memory cell,
    wherein the write circuit is operable to charge the capacitive circuit to first and second levels,
    wherein the write circuit is operable to couple the node to the memory cell through the bit line when charged to the first level to apply a first discharge current to the memory cell to change the memory cell to a corresponding first phase, and
    wherein the write circuit is operable to couple the node to the memory cell through the bit line when charged to the second level to apply a second discharge current to the memory cell to change the memory cell to a corresponding second phase.

21. The write circuit of claim 20 wherein the capacitive circuit comprises an RC-type circuit.

22. The write circuit of claim 21 wherein capacitances in the RC-type circuit comprises a plurality of capacitors coupled in parallel, with certain ones of the capacitors being activated to provide a desired capacitance value.

23. A memory device, comprising:
  a memory-cell array including a plurality of phase change memory cells formed from a material that is changeable between at least two phases, each phase corresponding to particular data stored in the memory cell; and
  a write circuit coupled to the memory-cell array, the write circuit including a capacitive circuit having a node coupled to a first end of a bit line in the memory-cell array, the bit line being coupled to the phase change memory cell,
    wherein the write circuit is operable to charge the capacitive circuit to first and second levels,
    wherein the write circuit is operable to couple the node to the memory cell through the bit line when charged to the first level to apply a first discharge current to the memory cell to chance the memory cell to a corresponding first phase, and
    wherein the write circuit is operable to couple the node to the memory cell through the bit line when charged to the second level to apply a second discharge current to the memory cell to change the memory cell to a corresponding second phase.

24. The memory device of claim 23 wherein the memory-cell array comprises a plurality of memory cells arranged in rows and columns, each memory cell including a calcogenic material and column of memory cells being coupled to a respective bit line, and the write circuit including a respective capacitive circuit associated with each bit line.

25. An electronic system, comprising:
  a memory device, including,
    a memory-cell array including a plurality of phase change memory cells formed from a material that is changeable between at least two phases, each phase corresponding to particular data stored in the memory cell; and
    a write circuit coupled to the memory-cell array, the write circuit including a capacitive circuit having a node coupled to a first end of a bit line in the memory-cell array, the bit line being coupled to the phase change memory cell,
      wherein the write circuit is operable to charge the capacitive circuit to first and second levels,
      wherein the write circuit is operable to couple the node to the memory cell through the bit line when charged to the first level to apply a first discharge current to the memory cell to change the memory cell to a corresponding first phase, and
      wherein the write circuit is operable to couple the node to the memory cell through the bit line when charged to the second level to apply a second discharge current to the memory cell to change the memory cell to a corresponding second phase.

26. The electronic system of claim 25 wherein the system comprises a computer system.

27. A method of writing data into a phase change memory cell, comprising:
- charging a capacitive circuit to a first charge level;
- charging a capacitive circuit to a second charge level;
- generating a first write current from the first charge level, the first write current having a substantially exponential discharge characteristic and a first amplitude, duration, and direction;
- generating a second write current, the second write current having a substantially exponential discharge characteristic and a second amplitude, a second duration, and the first direction; and
- applying a selected one of the first and second write currents to the phase change memory cell to write desired data into the memory cell.

28. The method of claim 27 wherein the substantially exponential discharge characteristic comprises an RC-type exponential discharge characteristic.

29. The method of claim 27 wherein the memory cell comprises a calcogenic material and wherein:
- generating the first write current corresponds to generating a set current associated with a crystalline or quasi-crystalline phase of the memory cell; and
- generating the second write current corresponds to generating a reset current associated with the memory cell to program the cell to an amorphous phase of the memory cell.

30. The method of claim 29 wherein the set current is terminated after a first time and wherein the reset current is terminated after a second time that is less than the first time.

31. The write circuit of claim 20 wherein the phase change memory cell comprises a calcogenic material.

* * * * *

UNITED STATES PATENT AND TRADEMARK OFFICE
CERTIFICATE OF CORRECTION

PATENT NO.        : 7,075,841 B2                                             Page 1 of 1
APPLICATION NO.   : 10/870694
DATED             : July 11, 2006
INVENTOR(S)       : Claudio Resta et al.

It is certified that error appears in the above-identified patent and that said Letters Patent is hereby corrected as shown below:

Column 10 line 36 change "chase chance" to --phase change--
Column 10 line 46 change "chance" to --change--
Column 10 line 51 change "chase" to --phase--
Column 10 line 61 change "chance" to --change--
Column 11 line 10 change "chases" to --phases--
Column 12 line 32 change "chance" to --change--

Signed and Sealed this

Nineteenth Day of December, 2006

JON W. DUDAS
*Director of the United States Patent and Trademark Office*